United States Patent
Hsiung et al.

(10) Patent No.: US 8,431,975 B2
(45) Date of Patent: Apr. 30, 2013

(54) BACK-SIDE ILLUMINATION IMAGE SENSOR

(75) Inventors: Chih-Wei Hsiung, Grand Cayman (KY); Fang-Ming Huang, Grand Cayman (KY); Chung-Wei Chang, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 268 days.

(21) Appl. No.: 13/018,365

(22) Filed: Jan. 31, 2011

(65) Prior Publication Data
US 2012/0193691 A1    Aug. 2, 2012

(51) Int. Cl.
*H01L 31/101* (2006.01)
*H01L 31/113* (2006.01)

(52) U.S. Cl.
USPC ........... 257/292; 257/447; 257/460; 257/466; 257/E27.133; 257/E27.122

(58) Field of Classification Search ................ 257/292, 257/447, 460, 466, E27.133, E27.122
See application file for complete search history.

(56) References Cited

U.S. PATENT DOCUMENTS

| | | | | |
|---|---|---|---|---|
| 5,726,081 | A * | 3/1998 | Lin et al. | 438/163 |
| 8,329,497 | B2 * | 12/2012 | Qian et al. | 438/69 |
| 2010/0025790 | A1 * | 2/2010 | Jang | 257/432 |
| 2010/0193845 | A1 * | 8/2010 | Roy et al. | 257/228 |
| 2011/0127408 | A1 * | 6/2011 | Yanagita et al. | 250/208.1 |
| 2011/0156113 | A1 * | 6/2011 | Jeon et al. | 257/292 |
| 2012/0049043 | A1 * | 3/2012 | Lee et al. | 250/208.1 |

* cited by examiner

*Primary Examiner* — Evan Pert
(74) *Attorney, Agent, or Firm* — Winston Hsu; Scott Margo

(57) ABSTRACT

A back side illumination (BSI) image sensor includes at least one pixel. The pixel area includes a photo diode and a transfer transistor. The transfer transistor has a control electrode made of a gate poly and a gate oxide for receiving a control instruction, a first electrode coupled to the photo diode, and a second electrode, wherein an induced conduction channel of the transfer transistor partially surrounds a recessed space which is filled with the gate poly and the gate oxide of the transfer transistor.

10 Claims, 4 Drawing Sheets

BACK-SIDE ILLUMINATION IMAGE SENSOR

BACKGROUND OF THE INVENTION

1. Field of the Invention

The present invention relates to a back-side illumination sensor, and more particularly, to a back-side illumination sensor with a reduced area.

2. Description of the Prior Art

As the pixel size of a complementary metal-oxide-semiconductor image sensor (CMOS image sensor, CIS) grows smaller, the degradation resulting from certain factors such as quantum efficiency, cross-talk and so forth in a sensor array also becomes significant. Regarding a conventional image sensor such as a front-side illuminated sensor, a lens of each pixel sensor is fabricated on a front side of a substrate. Therefore, the incident light has to travel through dielectric layers between circuitry formed by metal layers to arrive at a photo diode otherwise it will be reflected or absorbed by metal or any other reflective material.

In order to enhance the compactness of an image sensor, a back-side illumination (BSI) image sensor is introduced. In a BSI image sensor, the incident light is projected from a back side of a substrate of the image sensor, and therefore the front side of the substrate can be reserved for circuitry of various functions. Please refer to FIG. 1, which is a partial cross-section view of a pixel structure of a conventional BSI image sensor. The pixel for includes a photodiode 100, a transfer transistor 200, a reset transistor 500, and an isolation structure 400. The photo diode 100 is composed of an N-doped layer NL and a P-doped layer PL, and transfers incident light into electrical signals. The transfer transistor 200 (in this example, an N-type metal-oxide-silicon transistor fabricated on a P well) thereby transmits the electrical signals from the photo diode 100 into other circuits for subsequent processing via an N-doped connection path 300 according to a control instruction received at a gate electrode. The isolation structure 400 is fabricated herein to prevent noise from corrupting an integrity of the electrical signals. The reset transistor 500 is used for resetting the photodiode 100.

With the utilization of the BSI technology, there are more and more available areas on the front side of the substrate for building various functional circuits. To further exploit advantages of the BSI structure, however, more and more effort is dedicated to improve an area efficiency and compactness of a BSI image sensor.

SUMMARY OF THE INVENTION

It is therefore one of the objectives of the present invention to provide a back-side illumination image sensor with a more compact size to solve the above-mentioned problem.

According to one embodiment of the present invention, a back-side illumination (BSI) image sensor comprises at least one pixel area. The pixel area comprises a photo diode and a transfer transistor. The transfer transistor has a control electrode made of a gate poly and a gate oxide for receiving a control instruction, a first electrode coupled to the photo diode, and a second electrode, wherein an induced conduction channel of the transfer transistor partially surrounds a recessed space which is filled with the gate poly of the transfer transistor.

According to another embodiment of the present invention, a back-side illumination image sensor comprises at least one pixel area. The pixel area comprises a photo diode and a transfer transistor. The photo diode includes a first doped substrate and a second doped substrate. The transfer transistor has a control electrode made of a gate poly for receiving a control instruction, a first electrode coupled to the photo diode, and a second electrode, wherein the first doped substrate also serves as the first electrode of the transfer transistor.

According to yet another embodiment of the present invention, a back-side illumination image sensor comprises at least one pixel area. The pixel area comprises a photo diode and at least one transistor. The transistor has a control electrode made of a gate poly and a gate oxide for receiving a control instruction, a first electrode and a second electrode. An induced conduction channel of the transistor partially surrounds a recessed space which is filled with the gate poly and the gate oxide of the transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
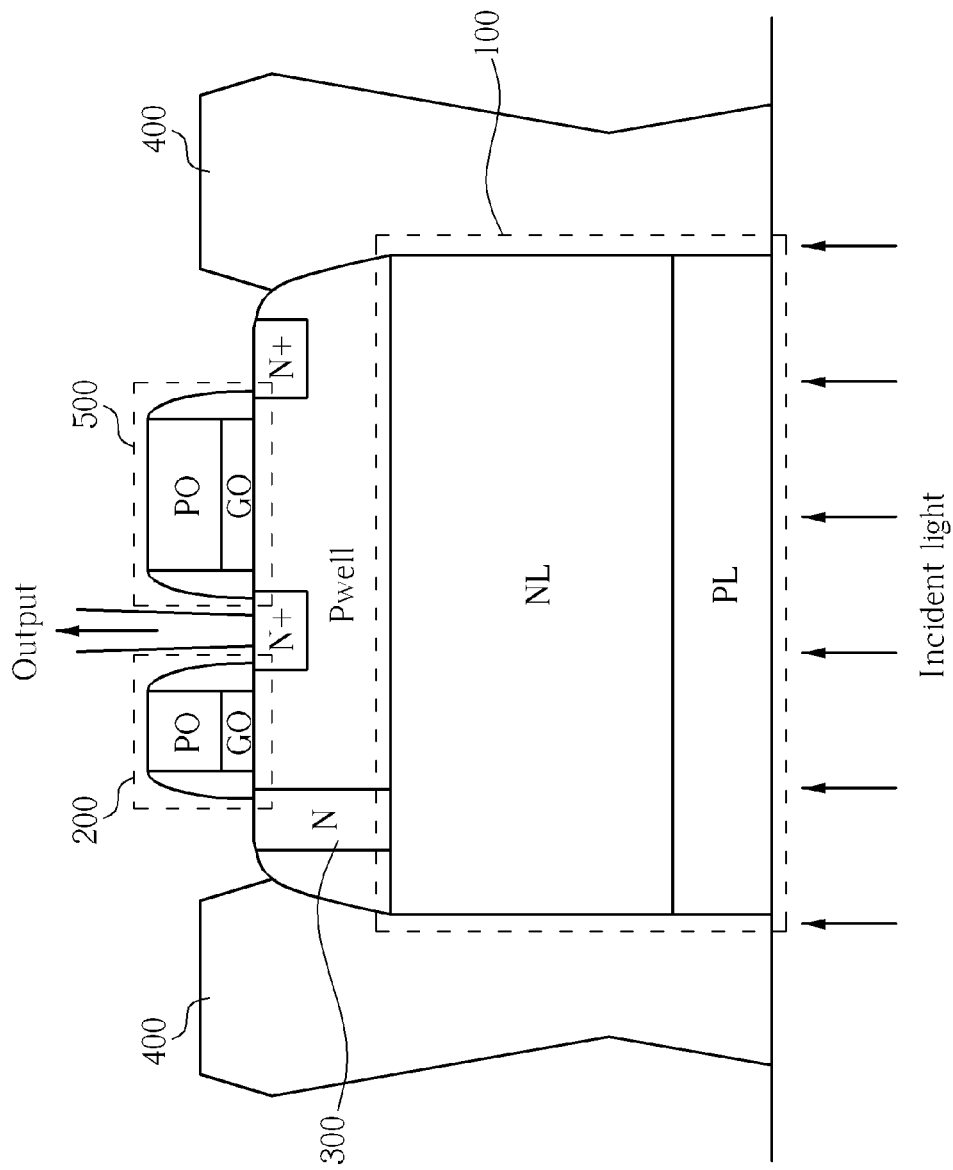
FIG. 1 is a partial cross-section view of a pixel structure of a conventional back-side illumination image sensor.

One concept of one embodiment of the present invention is to combine the N-doped layer NL of the photo diode 100 and the N-doped connection path 300. As can be seen from FIG. 1, the N-doped connection path 300 also serves as a drain electrode of the transfer transistor 200 to connect the N-doped layer NL of the photo diode 100. When the transfer transistor 200 is activated, a conduction channel will be induced horizontally under a gate oxide (denoted by GO in figures) of the gate electrode. Since the N-doped layer NL of the photo diode 100 and the N-doped connection path 300 are of the same doping type, both of them can be combined to serve their respective purposes. Based on such an observation, a plurality of exemplary BSI image sensor structures are proposed and detailed as below.

Figure 2:
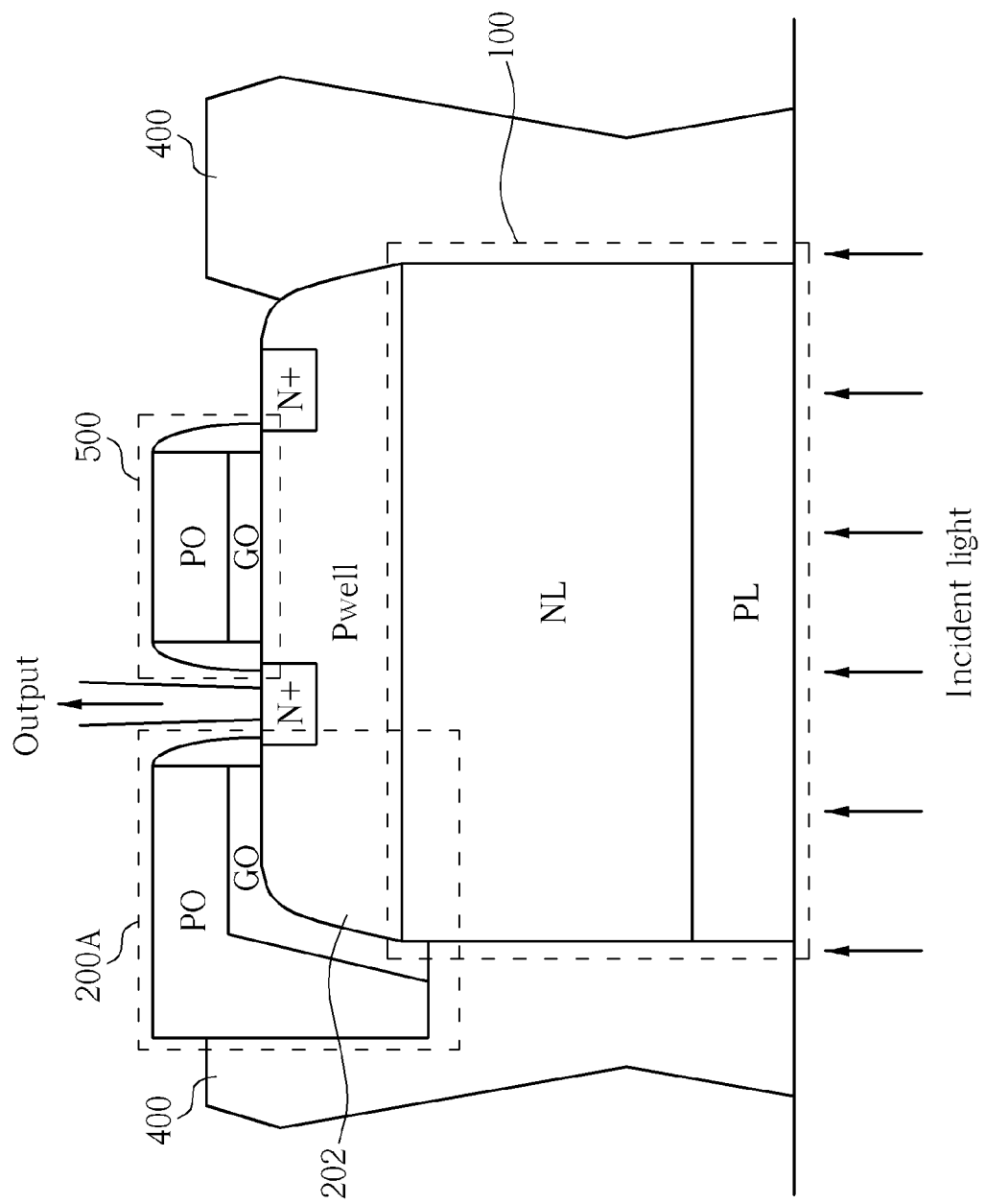
FIG. 2 is a partial cross-section view of a pixel structure of a back-side illumination image sensor according to an embodiment of the present invention.

Please refer to FIG. 2, which is a partial cross-section view of a pixel structure of a back-side illumination (BSI) image sensor according to an embodiment of the present invention. Compared with the conventional pixel structure in FIG. 1, the isolation structure 400 in FIG. 2 is trenched during the manufacturing process, and the gate poly (denoted by PO in the figures) and the gate oxide (denoted by GO in figures) of the gate electrode of a transfer transistor 200A is filled in a recessed space on the isolation structure 400, as shown in FIG. 2. As a consequence, when the transfer transistor 200A is activated, the N-doped layer NL of the photo diode 100 serves as an electrode (e.g., a drain electrode) of the transfer transistor 200A, and an induced conduction channel is formed partially surrounding the gate oxide of the transfer transistor 200A. The electrical signals from the photo diode 100 are thereby transmitted almost vertically instead of horizontally due to such an induced conduction channel. In this way, the area occupied by the transfer transistor 200A is greatly reduced when compared with the conventional BSI pixel structure in FIG. 1.

In another embodiment of the present invention, the substrate of the pixel structure can also be trenched to implement the recessed space. Please refer to FIG. 3, which is a partial cross-section view of a pixel structure of a BSI image sensor according to another embodiment of the present invention. Compared with the exemplary pixel structure in FIG. 2, the isolation structure 400 and the substrate 202 are both trenched for the recessed space during the manufacturing process, wherein the recessed space is then filled with the gate poly and the gate oxide of a transfer transistor 200B. In this embodiment, the N-doped layer NL of the photo diode 100 also serves as an electrode (e.g., a drain electrode) of the transfer transistor 200B, and the induced conduction channel of the transfer transistor 200B is formed almost vertically due to the recessed space formed in the isolation structure and the substrate. An area occupied by the transfer transistor 200B is also greatly reduced.

Figure 3:
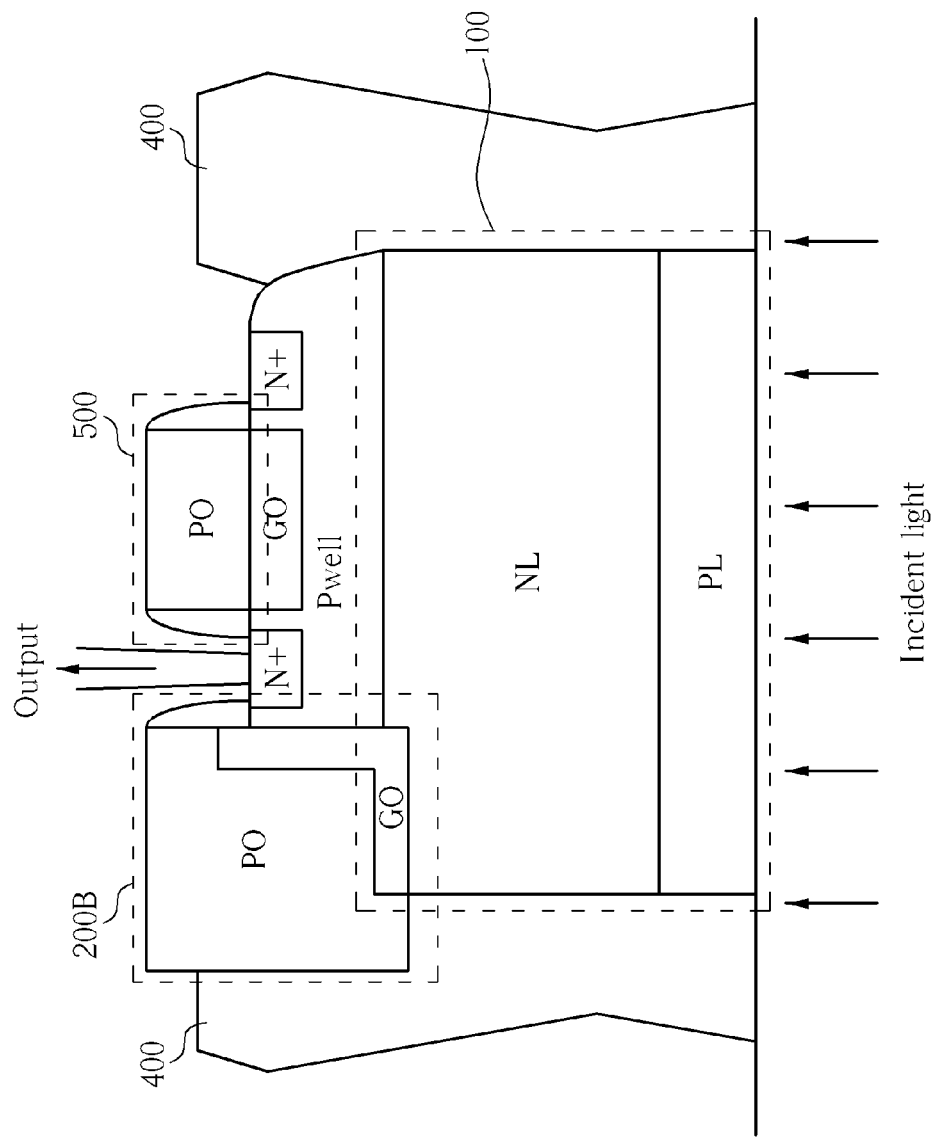
FIG. 3 is a partial cross-section view of a pixel structure of a back-side illumination image sensor according to another embodiment of the present invention.

Please note that the exemplary embodiments in FIG. 2 and FIG. 3 are for illustrative purposes only, and are not supposed to be limitations to the present invention. For example, the concept of the present invention can be utilized in a P-type substrate as well as an N-type substrate, i.e., the conduction type of a transistor or a photo diode can be either N-type or P-type.

Figure 4:
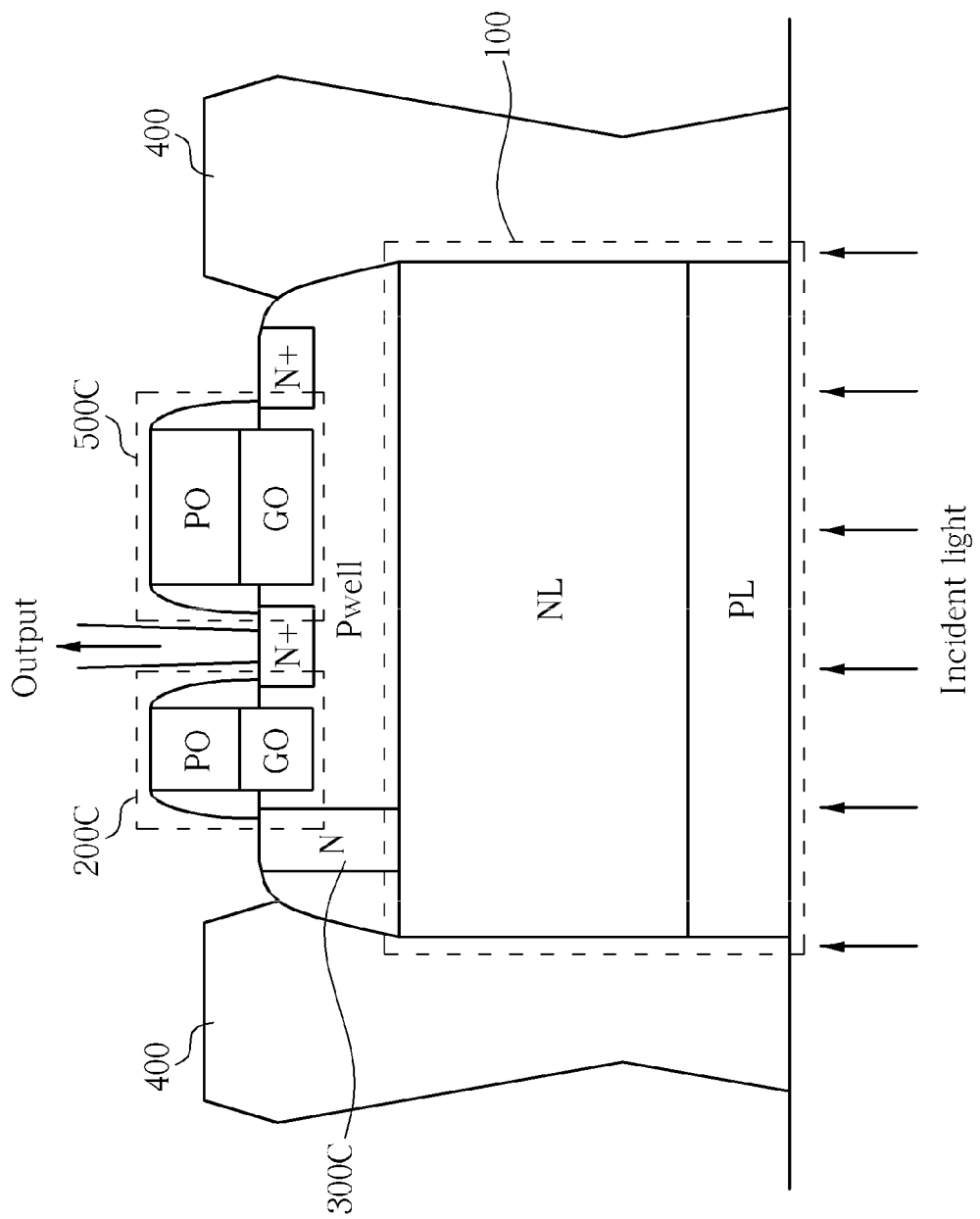
FIG. 4 is a partial cross-section view of a pixel structure of a back-side illumination image sensor according to yet another embodiment of the present invention.

Moreover, the recessed space is not limited to be formed upon an isolation structure, and it may also be designed solely upon the substrate. For an illustration of this, please refer to FIG. 4, which is a partial cross-section view of a pixel structure of a BSI image sensor according to yet another embodiment of the present invention. In this embodiment, gate oxides of a transfer transistor 200C and a reset transistor 500C are both located in recessed spaces on the substrate, and an N-type connection path 300C connects the photo diode 100 and the transfer transistor 200C. When the transfer transistor 200C (or the reset transistor 500C) is activated, a U-shaped conduction channel will be induced under the gate oxide, and the length of the gate electrode can be reduced while maintaining the same conduction channel length, leading to a more compact size of the pixel structure. These variations in design also fall within the scope of the present invention.

To summarize, exemplary embodiments of the present invention provide back-side illumination image sensors each having a more compact size. With the utilization of a recessed space during a manufacturing process, a conduction channel of a transistor can be formed askew or vertically (i.e., the conduction channel is not formed horizontally) when induced, leading to a smaller area occupied by the transistor within a pixel structure.

Those skilled in the art will readily observe that numerous modifications and alterations of the device and method may be made while retaining the teachings of the invention.

What is claimed is:

1. A back-side illumination (BSI) image sensor, comprising:
    at least one pixel area, comprising
        a photo diode; and
        a transfer transistor, having a control electrode made of a gate poly and a gate oxide for receiving a control instruction, a first electrode coupled to the photo diode, and a second electrode;
    wherein an induced conduction channel of the transfer transistor partially surrounds a recessed space which is filled with the gate poly and the gate oxide of the transfer transistor.

2. The BSI image sensor of claim 1, wherein the pixel area further comprises an isolation structure for providing isolation for the pixel area from other circuitry, and the recessed space is formed on the isolation structure only.

3. The BSI image sensor of claim 1, wherein the pixel area further comprises an isolation structure for providing isolation for the pixel area from other circuitry, and the recessed space is formed partially on the isolation structure and partially on a substrate of the pixel area.

4. The BSI image sensor of claim 1, wherein a conduction type of the transfer transistor is N type.

5. The BSI image sensor of claim 1, wherein a conduction type of the transfer transistor is P type.

6. The BSI image sensor of claim 1, wherein the photo-diode comprises a first doped substrate and a second doped substrate, and the first doped substrate also serves as the first electrode of the transfer transistor.

7. A back-side illumination (BSI) image sensor, comprising:
    at least one pixel area, comprising
        a photo diode, comprising a first doped substrate and a second doped substrate; and
        a transfer transistor, having a control electrode made of a gate poly and a gate oxide for receiving a control instruction, a first electrode coupled to the photo diode, and a second electrode, wherein the gate oxide is a non-planar structure;
    wherein the first doped substrate also serves as the first electrode of the transfer transistor.

8. The BSI image sensor of claim 7, wherein a conduction type of the transfer transistor is N type.

9. The BSI image sensor of claim 7, wherein a conduction type of the transfer transistor is P type.

10. A back-side illumination (BSI) image sensor, comprising:
    at least one pixel area, comprising
        a photo diode; and
        at least one transistor, having a control electrode made of a gate poly and a gate oxide for receiving a control instruction, a first electrode and a second electrode;
    wherein an induced conduction channel of the transistor partially surrounds a recessed space which is filled with the gate poly and the gate oxide of the transistor.

* * * * *